United States Patent [19]

McNutt

[11] Patent Number: 4,857,979

[45] Date of Patent: Aug. 15, 1989

[54] PLATINUM SILICIDE IMAGER

[75] Inventor: Michael J. McNutt, El Toro, Calif.

[73] Assignee: Ford Aerospace & Communications Corporation, Newport Beach, Calif.

[21] Appl. No.: 209,242

[22] Filed: Jun. 20, 1988

[51] Int. Cl.[4] ..................... H01L 29/78; H01L 27/14; H01L 31/00; H01L 29/56

[52] U.S. Cl. ........................................ 357/24; 357/15; 357/30; 358/213.26

[58] Field of Search ............................ 357/24, 30, 15; 377/57–63; 358/213.26

[56] References Cited

U.S. PATENT DOCUMENTS

| | | | |
|---|---|---|---|
| 4,040,076 | 8/1977 | Kosonocky et al. | 357/24 |
| 4,081,841 | 3/1978 | Ochi et al. | 357/24 LR |
| 4,336,556 | 6/1982 | Sekine et al. | 357/24 LR |
| 4,446,473 | 5/1984 | Pendleton | 357/24 LR |
| 4,467,340 | 8/1984 | Rode et al. | 357/24 |
| 4,531,225 | 7/1985 | Ohtsuki | 357/24 LR |
| 4,548,671 | 10/1985 | Kosonocky et al. | 156/643 |
| 4,620,231 | 10/1986 | Kosonocky | 358/213.26 |
| 4,638,345 | 1/1987 | Elabd et al. | 357/24 |
| 4,667,213 | 5/1987 | Kosonocky | 357/24 LR |
| 4,672,412 | 6/1987 | Wei et al. | 357/30 |

OTHER PUBLICATIONS

Sei et al., "A Meander Channel CCD Linear Image Sensor", IEEE Trans. Electron Devices, vol. ED-25 (2/78), pp. 140–144.

1983 IEEE Electron Device Letters, vol. EDL-4, No. 3, Mar. 1983: "A PtSi Schottky-Barrier Area Imager with Meander-Channel CCD Readout Registers", Authors: K. Tanikawa, Y. Ito and A. Shimohashi, pp. 66–67.

1985 EEEE Transactions on Electron Devices, vol. ED-32, No. 8, Aug. 1985: "160×244 Element PtSi Schottky-Barrier IR-CCD Image Sensor", Authors: Kosonocky, Shallcross, Villani and Groppe, pp. 1564–1573.

Primary Examiner—Gene M. Munson
Attorney, Agent, or Firm—Harry G. Weissenberger; Edward J. Radlo; Keith L. Zerschling

[57] ABSTRACT

The fill factor in a Pt:Si imager is greatly improved by (1) biasing the reflector plate as a field plate to eliminate the need for an N⁻ guard ring along the edges of the imaging diodes; (2) reconfiguring the meander channel to use a single meander channel for two columns of diodes; and (3) using a self-demultiplexing output bus structure which requires no separate array space for clocking buses. Two different types of dual-sided meander channel are described.

12 Claims, 6 Drawing Sheets

PLATINUM SILICIDE IMAGER

FIELD OF THE INVENTION

This invention relates to platinum silicide (Pt:Si) cell arrays for infrared imaging, and more particularly to an array which exhibits a maximized fill factor.

BACKGROUND OF THE INVENTION

Platinum silicide imagers are often preferred in the manufacture of infrared imaging devices because they are reliable and relatively inexpensive to manufacture. Unfortunately, platinum silicide Schottky diodes have a very low quantum efficiency (on the order of 1%), so that it becomes necessary to use as much of the available array surface as possible for photon induced charge generation. This is known as maximizing the fill factor.

Two circumstances militate against the maximization of the fill factor: one is the need for suppressing the leakage current caused by local fields along the edges of the extremely thin Pt:Si layer of the pixel cells; the other is the space required for the readout channels which convey the charges built up in the pixel cells to the outside world. Pertinent prior art in this area of technology includes: Kosonocky, et al. U.S. Pat. No. 4,548,671 which describes a basic Pt:Si focal plane array but does not describe any of the improvements contemplated herein; Elabd et al. U.S. Pat. No. 4,638,345 which discloses the $N^-$ guard ring implant which is eliminated by one aspect of the present invention; Rode et al. U.S. Pat. No. 4,467,340 which contains a good background discussion of Schottky barrier detector array technology but relates to a hybrid multiplexing scheme not relevant to the monolithic circuit of this invention; Kosonocky et al. U.S. Pat. No. 4,040,076 which describes a charge-skimming scheme not used in the present invention; and Wei et al. U.S. Pat. No. 4,672,412 which describes an AC-coupled randomly addressable Schottky photodiode array with a high fill factor but which is considerably more noisy and less sensitive, and is inapplicable to the charge-coupled devices involved in the present invention; Tanikawa et al., "A PtS: Schottky-Barrier Area Imager with Meander-Channel CCD Readout Registers", *IEEE Electron Device Letters*, Vol. EDL-4, No. 3, March 1983, which describes a meander channel serving as both the vertical and horizontal readout; and Kosonocky et al., "160×244 Element PtS: Schottky-Barrier IR-CCD Image Sensor", *IEEE Transactions on Electron Devices*, Vol. ED-32, No. 8, Aug. 1985, which shows channels serving one column of cells and an $N^-$ guard ring.

SUMMARY OF THE INVENTION

The present invention achieves a considerable improvement in the fill factor with no detriment to the operational qualities of a Pt:Si Schottky barrier diode focal plane array by combining a novel method of leakage control with a novel type of meander channel structure including a self-demultiplexing readout.

Leakage current along the edges of the Pt:Si layer of the pixel cells in the array of this invention is essentially eliminated by positively biasing the existing aluminum photon reflector plate of the array as a field plate to create a surface depletion layer around the periphery of the Pt:Si diode. This produces the same leakage current suppression as the $N^-$ guard ring of the prior art but without reducing the infrared-sensitive area of the diode.

Although, at most currently conventional bias voltage levels, the reflector plate can be biased to the same voltage as the reverse bias of the Pt:Si diode by merely connecting the Pt:Si layer and the reflector plate to the same bias voltage source, an ancillary aspect of the invention is that by using separate bias sources for the diode and the reflector plate, the diode bias can be increased to levels at which substantially improved response of the array at longer wavelengths can be achieved.

In a second major aspect of the invention, a substantial reduction in the space required by the readout circuitry is achieved by the use of a novel self-aligning meander channel construction which makes possible the readout of two columns of cells with a single readout structure of small width and low manufacturing complexity.

Because the meander channel structure of this invention produces readouts of successive rows of alternating columns, the invention further discloses a novel demultiplexing scheme in which the signals from each pair of adjacent pixel cells of any given row are stored side by side in a readout bus which can be read out at high speed during a single operational cycle of the meander channel.

DETAILED DESCRIPTION OF THE DRAWINGS

Figure 1:
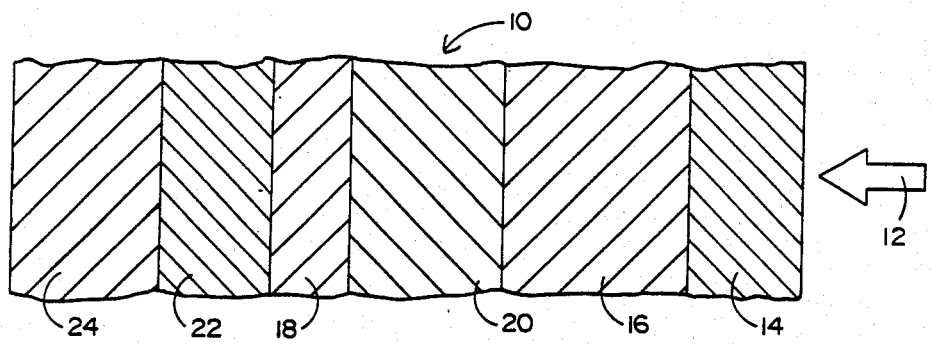
FIG. 1 is a cross section of an imager cell of the type to which this invention relates.

FIG. 1 is a cross section of a typical platinum silicide imager cell. Infrared photons from the imager optics (not shown) strike the cell 10 from the direction 12. They penetrate the $SiO_2$ insulating layer 14, which typically may have a thickness on the order of 7,000 Å, and continue through the $P^+$ silicon substrate layer 16 which may have a thickness on the order of 0.5 mm and serves as a ground connection.

The Pt:Si layer 18 and the $P^-$ silicon epitaxial layer 20 together form a Schottky barrier diode which is the heart of the imager cell. The Pt:Si layer 18 may have a thickness on the order of 20 Å, and the $P^-$ silicon layer 20 may have a thickness on the order of 10 μm. Some of the photons are absorbed by the Pt:Si layer 18, where absorption and subsequent photoemission of energetic holes produces a residual charge which can be collected as the imaging signal. The absorption efficiency of the Pt:Si layer is less than 50%. Consequently, in order to capture as many photons as possible, the Pt:Si layer 18 is backed by an insulating SiO$_2$ layer 22 with a thickness on the order of 6,000 Å and a reflective aluminum layer 24 with a thickness on the order of 10,000 Å. The aluminum layer 24 reflects the photons which are not absorbed by the Pt:Si layer 18 and gives them another chance of absorption on the return trip.

It has long been known that considerable leakage of charges occurs along the edges of the extremely thin Pt:Si layer 18. To prevent this, the prior art has implanted an N− guard ring in the P− layer 20 along the edges of the Pt:Si layer 18. The disadvantage of this expedient is that the cell 10 is incapable of producing infrared photoemission of holes in the area of PtSi overlying the guard ring. Inasmuch as registration tolerances in manufacture require the guard ring to be of a significant width with respect to the width of individual cells, the effective area of each cell is significantly reduced by the use of the guard ring.

In view of the low quantum efficiency of the Pt:Si cell, it is imperative to utilize the maximum possible area of any given imaging array for photogeneration of charge. The invention achieves this in one of its aspects by eliminating the guard ring of the prior art and instead applying a positive bias to the aluminum layer 24 which extends beyond the edges of the PtSi layer 18. This bias creates a mild depletion of the epitaxial 20 at the edge of the PtSi layer 18, and thus suppresses leakage without interfering with the photoemission ability of the Schottky diode 18, 20 over its entire area.

Typically, the bias applied to the aluminum layer 24, which thereby becomes a field plate overlying the entire cell array, may preferably be about the same as the bias of the Pt:Si layer 18; in fact, it is convenient to simply electrically connect the two layers together. However, in one aspect of the invention, it may be desirable to bias the Pt:Si layer at a considerably higher voltage (on the order of 30–40 volts) than is currently the practice, so as to make the cell responsive to longer wavelengths of light. If this is done, it is preferable to provide a separate bias source for the field plate 24 common to all cells and to bias the field plate at a higher level than the Pt:Si layer 18.

In the prior art, it has been conventional to read out charges from individual cells of an imaging array by the use of meander channels which can be clocked to transfer charges from individual cells sequentially into a readout bus. Because it is advantageous to read cells out row by row, it has been conventional to provide one readout channel for each column for cells 10. This consumes considerable array space and, for the reasons previously noted, reduces the efficiency of the array. In accordance with the present invention, a meander readout channel scheme is provided which allows the provision of one readout channel for each pair of Pt:Si diodes. One preferred embodiment of such a channel is shown in FIGS. 2 and 3.

Figure 3:
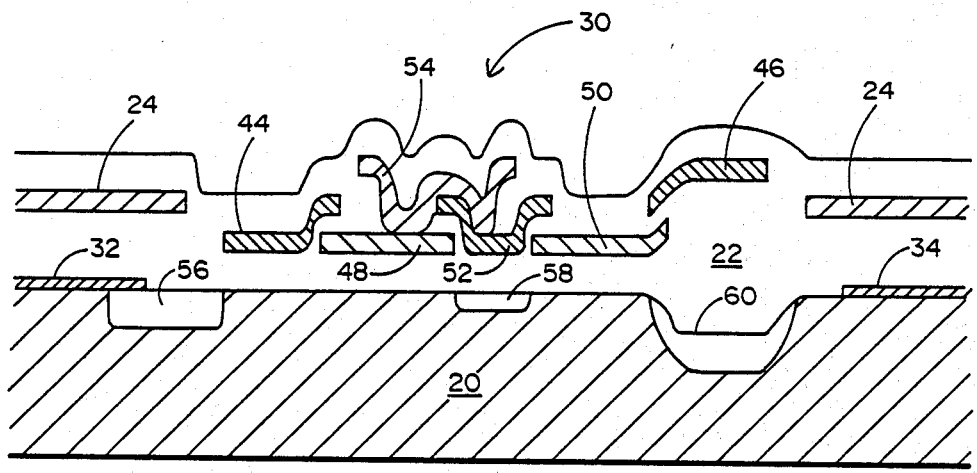
FIG. 3 is a vertical section along line 3—3 of FIG. 2.
Figure 2:
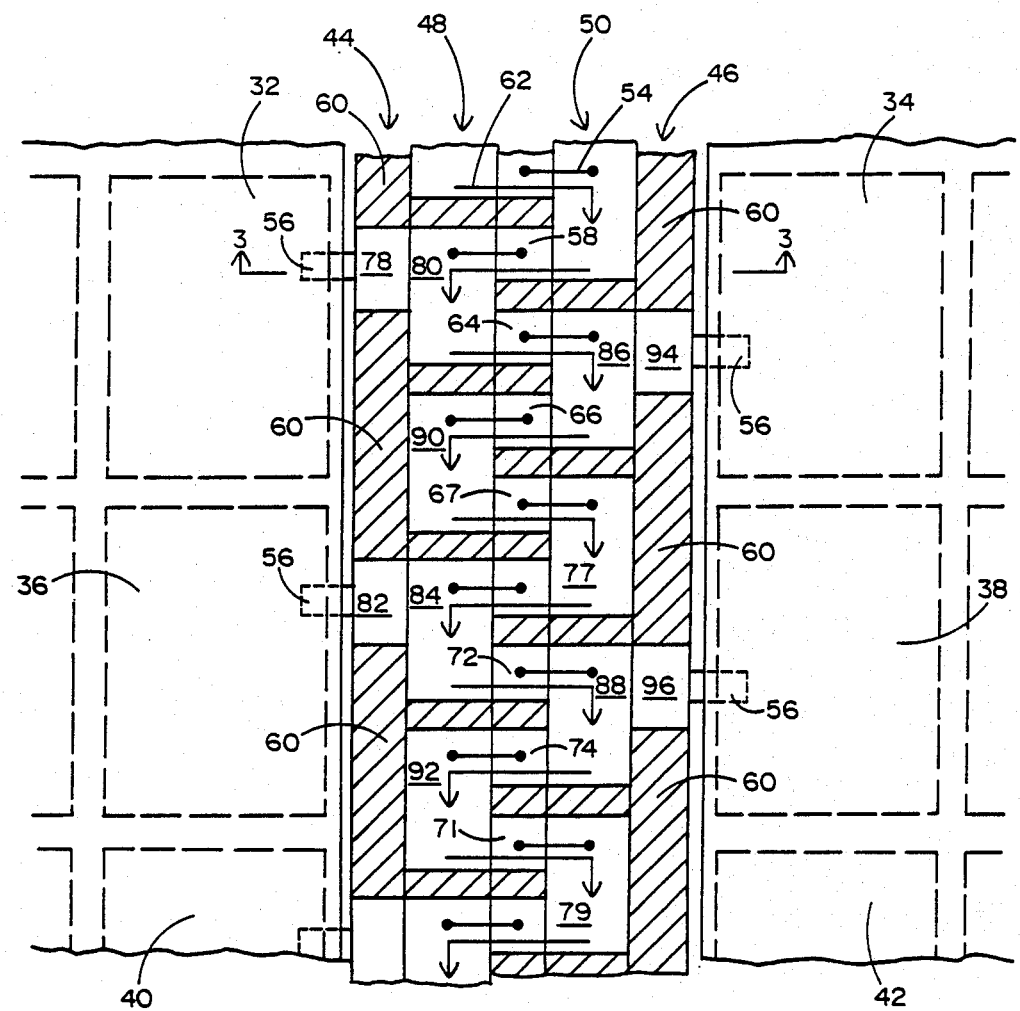
FIG. 2 is a plan view of a portion of a cell array constructed in accordance with the invention.

FIG. 2 is a somewhat schematic plan view of the channel of this invention, while FIG. 3 is a vertical section of the channel along line 3—3 of FIG. 2. As best seen in FIG. 3, the charge-coupled device (CCD) meander channel 30 formed in the oxide or nitride insulating layer 22 is disposed between the columns of Pt:Si diodes 32, 36, 40 and 34, 38, 42, and consists of transfer gates 44, 46 of heavily doped polysilicon; clock gates 48, 50 of a like material; a barrier gate 52 also of the same material; and a metallic (e.g. aluminum) connector plate 54 (shown schematically in FIG. 2) which, in the section of FIG. 3, interconnects clock gate 48 and barrier gate 52.

A small floating N+ implant 56 serves as a charge transfer contact between the Pt:Si diode 32 and the transfer gate 44. When a well level voltage is applied to the transfer gate 44, the charges accumulated by the Pt:Si diode 32 are transferred to the region under clock gate 48.

A P barrier 58 is implanted between the clock gates 48, 50 underneath the barrier gate 52 so as to create a barrier potential which prevents backflow of charges as described in more detail hereafter. An interlocking series of P+ channel stops 60 shaped like inverted F's in FIG. 2 are also formed in the substrate 16 to block charge flow and constrain it to the meander path described below.

A major problem in miniaturized devices of this type (the total width of channel 30 may be on the order of 40 μm) is the proper alignment of the gates and implants. In the prior art, meander channel CCD's using a two-phase clock scheme with barrier implants employ an upper polysilicon phase 1 clock gate overlapping a lower polysilicon phase 2 clock gate. This approach suffers from spurious potential barriers and wells caused by misalignment of the clock gates with respect to the barrier implant. The present invention inherently solves this problem by first implanting the P+ stops 60, then depositing both the phase 1 and phase 2 clock gates 48, 50 as lower polysilicon strips. The barrier implants 58 are made through the gap between the gate strips 48, 50, and the barrier and transfer gates 52, 44 and 46 are then deposited as upper polysilicon in an overlapping relationship to the clock gate strips 48, 50. Finally, the aluminum contact pads 54 and field plates 24 are deposited over the remainder of the circuitry. In this manner, all components of the channel 30 are automatically self-aligned, and are free of any spurious potential barriers or wells.

The progression of charges along the meander channel 30 during readout is illustrated by arrows 62 and by Table I which lists the relative potentials (B for barrier, W for well) of the various elements of the channel 30, and the movement of the charges, at successive clock times.

TABLE I

| Clock time | Transfer gate 44 | Clock gate 48 | Barrier gates 66, 74 | Barrier gates 64, 72 | Clock gate 50 | Transfer gate 46 | Charge Diode | migration From | migration To |
|---|---|---|---|---|---|---|---|---|---|
| (1) | B | B | B | W | W | W | 34 / 38 | 34 / 38 | 86 / 88 |
| (2) | B | B | B | W | W | B | x | x | x |
| (3) | W | W | W | B | B | B | 34 / 38 / 32 / 36 | 86 / 88 / 32 / 36 | 90 / 92 / 80 / 84 |

TABLE I-continued

| Clock time | Transfer gate 44 | Clock gate 48 | Barrier gates 66, 74 | Barrier gates 64, 72 | Clock gate 50 | Transfer gate 46 | Charge Diode | migration From | migration To |
|---|---|---|---|---|---|---|---|---|---|
| (4) | B | W | W | B | B | B | x | x | x |
| (5) | B | B | B | W | W | B | 34 | 90 | 100 |
|     |   |   |   |   |   |   | 38 | 92 | 102 |
|     |   |   |   |   |   |   | 32 | 80 | 86 |
|     |   |   |   |   |   |   | 36 | 84 | 88 |

At time (1), transfer gate 46 is enabled. The charges from diode 34 flow through transfer gate section 94 of the meander channel into its clock gate section 86, and the charges from diode 38 flow through transfer gate section 96 into clock gate section 88. At time (2), transfer gate 46 is disabled, and the charges stay where they are. At time (3), transfer gate 44 and clock gate 48 are enabled, and clock gate 50 is disabled. The charges from diodes 32, 36 move across transfer gate sections 78, 82 into clock gate sections 80, 84, and the charges from sections 86, 88 move into sections 90, 92. At time (4), transfer gate 44 is disabled again, and again all charges stay where they are.

At time (5), all the clock gates and barrier gates reverse voltage levels. The charges in sections 80, 84, 90 and 92 flow, respectively, across barrier gates 64, 72, 67 and 71 into clock gate sections 86, 88, 77 and 79.

With all the charges from the diode columns in which diodes 32 through 38 are located now being in the channel 30, the voltage level of the clock gates and barrier gates is alternated back and forth, without further operation of the transfer gates 44, 46, until all the charges in the channel 30 have been successively read out from the bottom of the channel 30. The scheme then returns to the time (1) condition, and the next readout of the diode array begins.

It will be noted that in the inventive scheme, the readout is by rows, i.e. successive charges arriving at the bottom of the channel 30 are those from diodes 38, 36, 34 and 32, in that order. This makes possible a simple scan of the array in the manner described below in connection with FIGS. 6 and 7.

Figure 4:
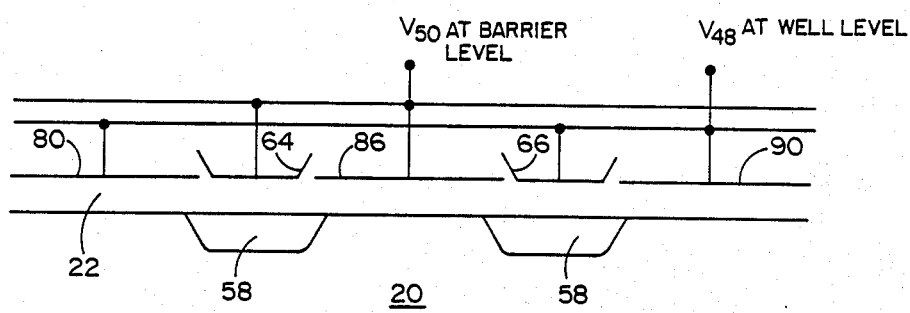
FIG. 4 is a schematic representation of the meander channel of this invention illustrating the voltages applied to various components during a transfer.
Figure 5:
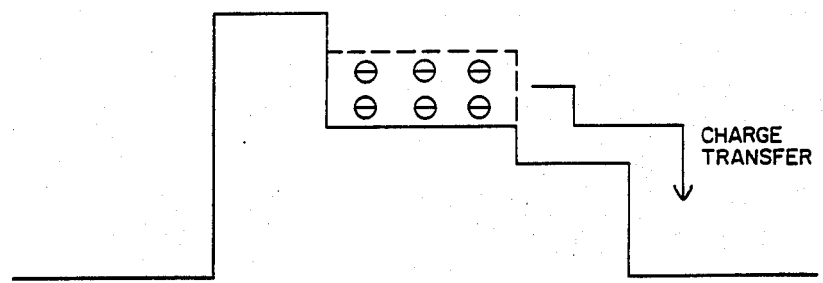
FIG. 5 is an electron potential diagram illustrating the charge transfer of FIG. 4.

FIGS. 4 and 5 illustrate the operation of the barrier gates 58-74. FIG. 4 is a schematic representation of a sequence of three clock gate sections 80, 86, 90 and two barrier gates 64, 66 along the meandering path. FIG. 5 shows the potential levels produced by the clocking voltages of FIG. 4 in the gates of FIG. 4.

The implants 58 cause the electron potential under barrier gates 64, 66 to always be somewhat higher than the electron potential under the clock gate section to which they are connected. Thus the electron potential under barrier gate 64 is higher than that under clock gate section 86. The electron potential under barrier gate 66 is higher than that under clock gate section 90, but lower than that under clock gate section 86. Consequently, with clock gate sections 80 and 90 at well level, and clock gate section 86 at barrier level, the charge in section 86 cannot leak back into section 80 but must flow forward into section 90.

Figure 6:
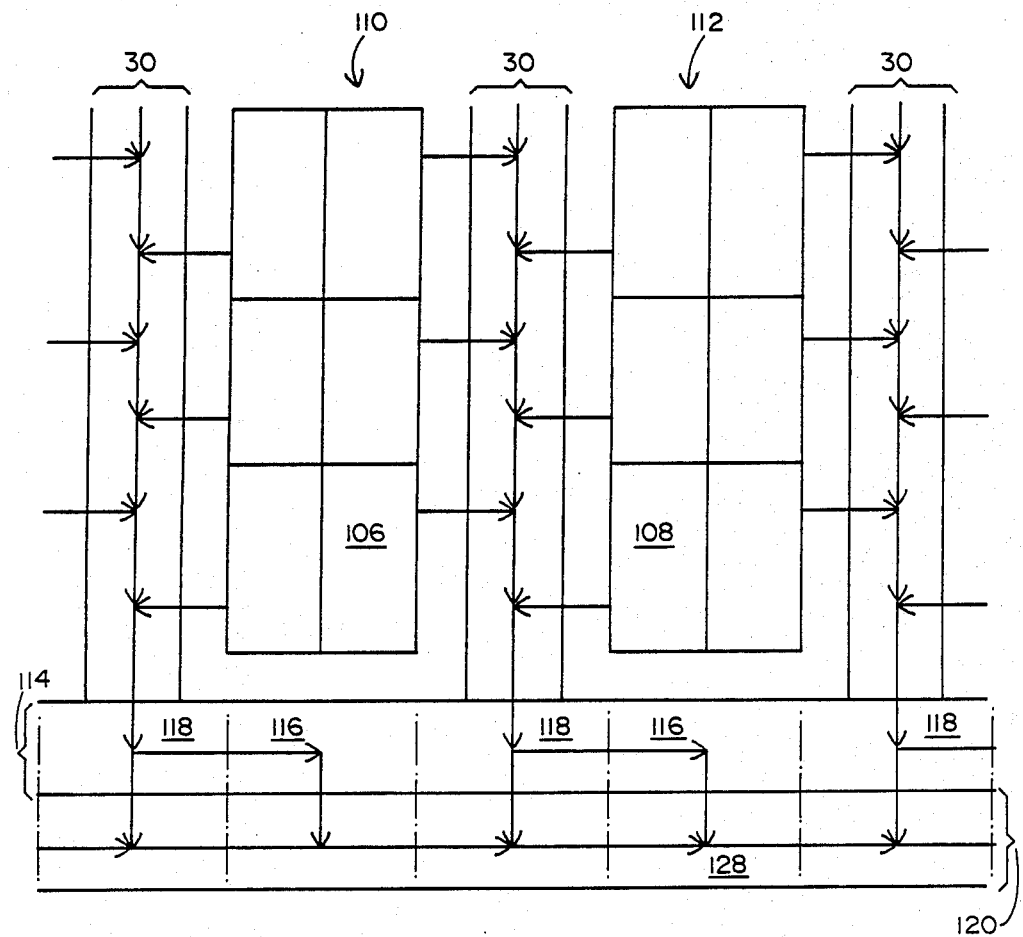
FIG. 6 is a schematic diagram illustrating the readout multiplexing of this invention.

In accordance with the invention, full rows of detector diode information are reconstructed in a serial output bus by the scheme shown in FIG. 6. Charges from the diodes of columns 110 and 112 are transferred into the meander channel 30 as described above, using a clock rate of e.g. 15.4 kHz. At the bottom of the channel 30, the charges in the channel 30 are clocked in pairs into a buffer or demultiplexer channel or bus 114 which has successive groups of storage areas or sections. The first charge of each pair is stored in the section 116 of the pair, while the second charge is stored in the section 118. After each pair of charges (representing, for example, diodes 38 and 36) is stored, the sections of buffer channel 114 containing charges are transferred in parallel into corresponding sections of the readout channel 120, which is then read out serially at high speed (e.g. 0.98 MHz), so as to be fully read out when the next pair of charges is stored in each of the buffer sections 116, 118. In a 128×128 detector diode array, this results in an image readout at a 60 Hz frame rate.

Figure 7:
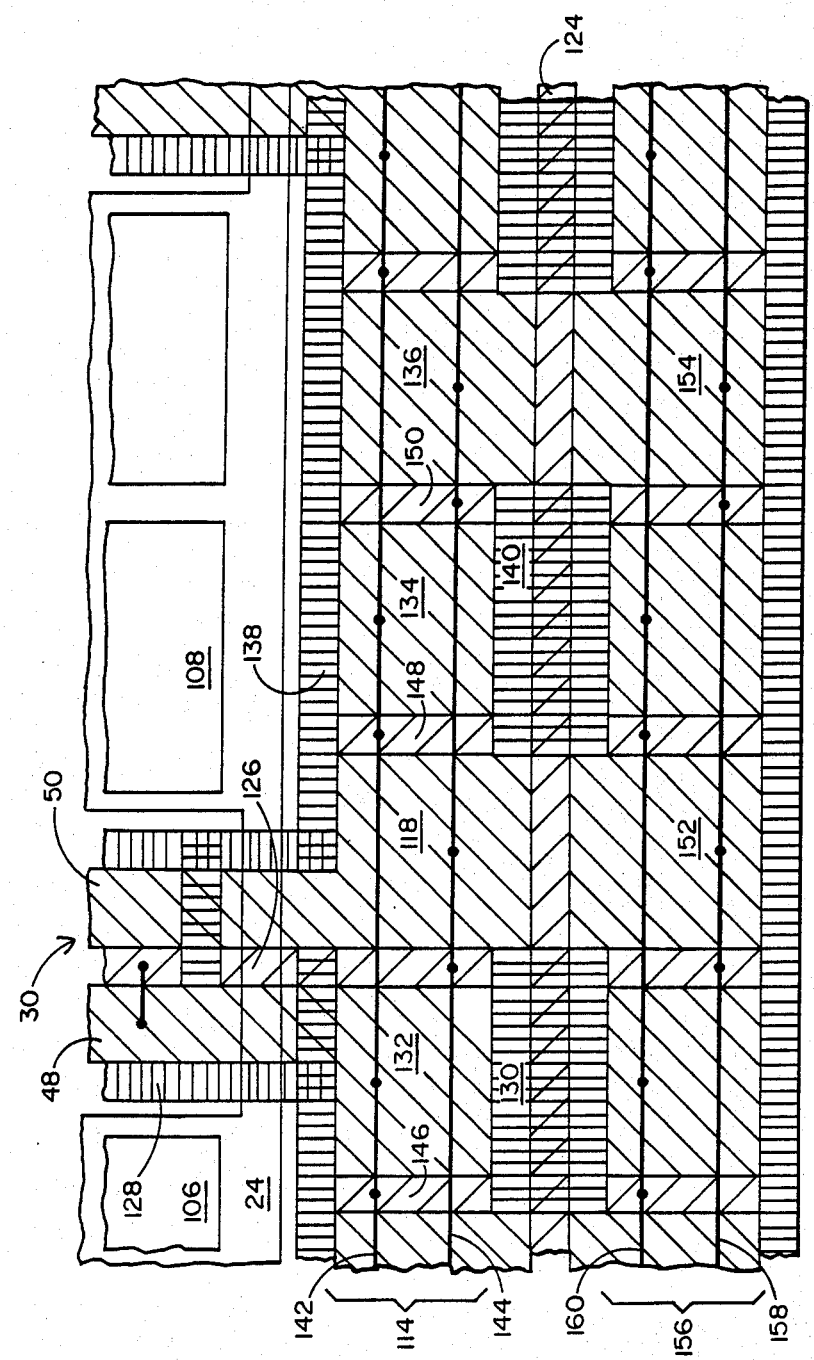
FIG. 7 is a plan view of a portion of the array and channels carrying out the scheme of FIG. 6.

FIG. 7 shows the implementation of the scheme of FIG. 6 in accordance with the invention. In FIG. 7, the transfer gates 44, 46 and the routine structural overlaps are omitted for clarity.

The lowermost storage section 118 of clock gate 50 is extended into the buffer channel 114 until it abuts the readout transfer gate 124 formed as an upper polysilicon strip along the bottom of the detector array. The lowermost barrier gate 126 also extends across the P+ stop 128 until it abuts P+ stop 130. Clock gate strip 48 also continues across P+ stop 128 to form the isolated charge storage area 132.

Two additional gates are formed in the lower polysilicon layer of FIG. 3 to create charge storage areas 134, 136 in the buffer channel 114 below the P+ stop 138 of FIG. 7 Area 134 is isolated by the P+ stop 140, while area 136 abuts the transfer gate 124.

The buffer channel 114 is overlaid lengthwise by a pair of metallic clock buses 142, 144 shown schematically. Bus 142 provides clocking for the clock gate 48 by its connection to the integrally formed gate of area 132, and also provides clocking for the area 134 and for barrier gates 146, 148. Bus 144 provides clocking for the clock gate 50 by its connection to the gate of area 118, and also provides for barrier gates 126 and 150.

When a set of charges from the meander channel 30 has been clocked into storage areas 118, 136, storage areas 152, 154 of the readout channel 156 are clocked into a well condition by bus 158, and transfer gate 124 is enabled to move the charge packets from areas 118 and 136 to areas 152 and 154, respectively. The transfer gate 124 is then disabled, and the readout channel 156 is read out at high speed by alternate clocking of buses 158, 160 while the next set of charge packets is clocked into areas 118, 136.

The layout of FIG. 7 has several advantages. For one, it makes possible the use of one meander channel 30 for each pair of diode columns, thereby saving almost half the array devoted to meander channel CCD's in the prior art. Secondly, the layout of FIG. 7 preserves the order of the charge readouts in such a way that each row can be read out serially without rearrangement. Thirdly, the layout of FIG. 7 saves considerable channel space on the array because it requires no separate clock buses for the clock gates of the meander channels, in contrast to traditional comb gate CCD designs.

Figure 8:
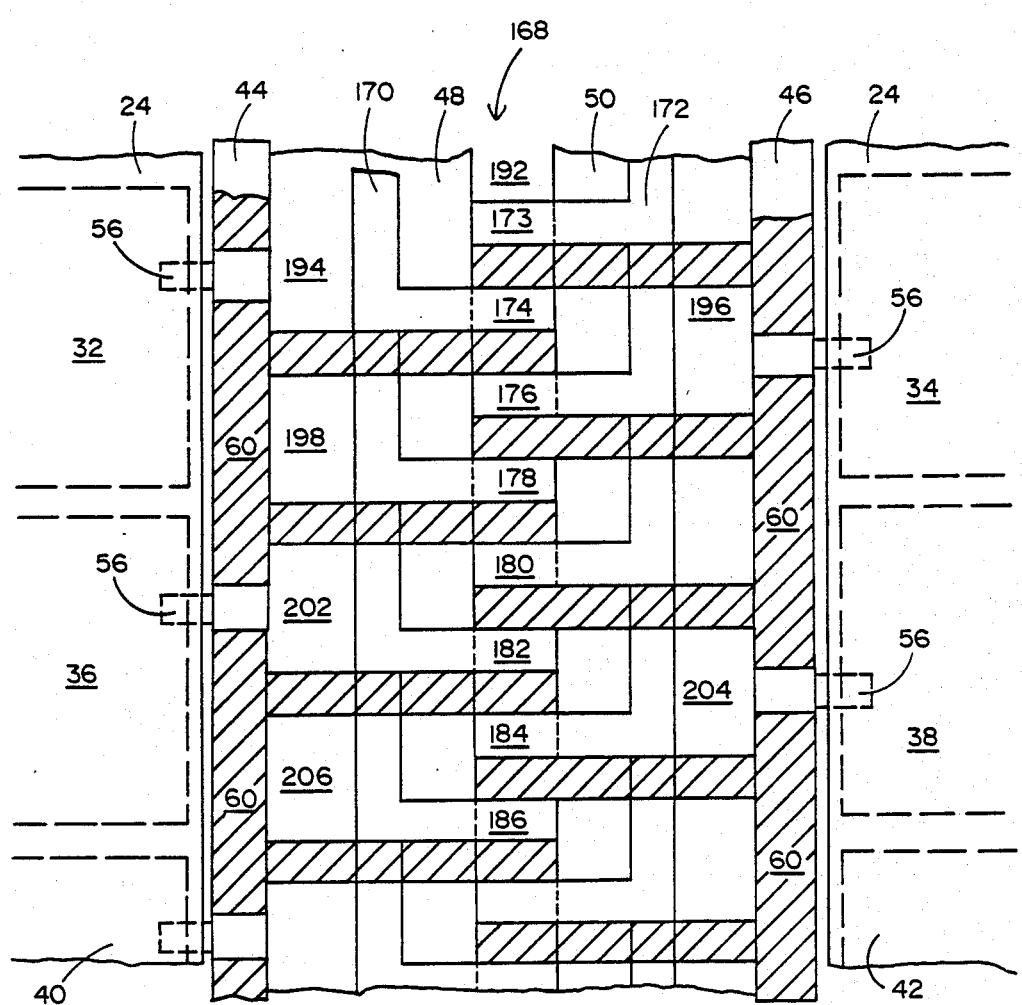
FIG. 8 is a view similar to FIG. 2 but illustrating an alternative embodiment of the inventive meander channel.

FIG. 8 illustrates (somewhat schematically to eliminate confusing overlaps) an alternative meander channel embodiment that requires no barrier gates (which are somewhat tricky to manufacture reliably), and that is therefore much more forgiving in terms of manufacturing tolerances.

FIG. 8 again shows the Pt:Si diodes 32, 34, 36 and 38, the field plate 24, the N+ implant contacts 56, the transfer gates 44, 46, the clock gates 48, 50, and the P+ channel stops 60 as in FIGS. 2 and 3. However, in the embodiment of FIG. 8, the barrier gates 58 through 76 are replaced by a second pair of clock gates 170, 172 which are located in the upper polysilicon layer of FIG. 3 and whose vertical strip (in FIG. 8) overlies the clock gate strips 48, 50. Each of the upper clock gates 170, 172 has a set of arms 174, 178, 182, 186, 190 and 176, 180, 184 and 188, respectively, which extend across the gap 192 between the lower clock gate strips 48, 50. Where the upper clock gates 170, 172 overlie the lower clock gates 48, 50, any clocked charges are inherently controlled by the lower clock gate strips 48, 50 only, and the upper clock gate strips 170, 172 serve only to convey the clocking voltages. In the gap 192, however, the arms 174 through 190 are capable of storing and transferring charge packets.

The P+ channel stops 60 divide the areas under lower clock gate strips 48, 50 into charge storage sections 194, 198, 202, 206, 210 and 196, 200, 204, 208, respectively. The charge packets from diodes 32 through 38 move between these sections under the arms 174-190 by clocking wells and barriers into the clock gate strips 48, 50, 170, 172 in accordance with Table II:

TABLE II

| Clock Time | Trf. Gate 44 | Clk. Gate 48 | Clk. Gate 170 | Clk. Gate 172 | Clk. Gate 50 | Trf. Gate 46 | Charge Diode | Migration From | To |
|---|---|---|---|---|---|---|---|---|---|
| (1) | B | B | W | W | W | W | 34 | 34 | 174,196,176 |
|     |   |   |   |   |   |   | 38 | 38 | 182,204,184 |
| (2) | B | B | B | W | W | B | 34 | 174,196,176 | 196,176 |
|     |   |   |   |   |   |   | 38 | 182,204,184 | 204,184 |
| (3) | B | W | B | W | W | B | 34 | 196,176 | 196,176,198 |
|     |   |   |   |   |   |   | 38 | 204,184 | 204,184,206 |
| (4) | B | W | B | W | B | B | 34 | 196,176,198 | 176,198 |
|     |   |   |   |   |   |   | 38 | 204,184,206 | 184,206 |
| (5) | W | W | W | W | B | B | 34 | 176,198 | 176,198,178 |
|     |   |   |   |   |   |   | 38 | 184,206 | 184,206,186 |
|     |   |   |   |   |   |   | 32 | 32 | 173,194,174 |
|     |   |   |   |   |   |   | 36 | 36 | 180,202,182 |
| (6) | B | W | W | B | B | B | 34 | 176,198,178 | 198,178 |
|     |   |   |   |   |   |   | 38 | 184,206,186 | 206,186 |
|     |   |   |   |   |   |   | 32 | 173,194,174 | 194, 174 |
|     |   |   |   |   |   |   | 36 | 180,202,182 | 202,182 |

At time (1), transfer gate 46 is enabled to form a well, and the charges from diodes 34 and 38 are transferred into the wells extant at that time in sections 174, 196, 176 and 182, 204, 184, respectively. The transfer gate 46 is disabled at time (2), and the progression of the wells in accordance with Table II then moves the charge packets from diodes 34 and 38 along the meander channel. At time (5), the enabling of transfer gate 44 places the charge packets from diodes 32 and 36 into the channel 168, and the progression continues. After time (6), the circuit continues to cyclically iterate to convey the charges along the meander channel 168 until all charge packets have been read out at the bottom of the channel 168. The circuit then returns to time (1) for the next frame of the detector image.

Figure 9C:
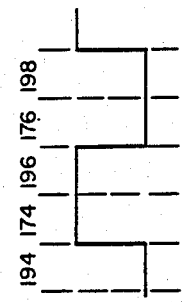
FIGS. 9a through 9c are charge diagrams illustrating the charge flow during a switching operation in the clocking of the embodiment of FIG. 8.
Figure 9B:
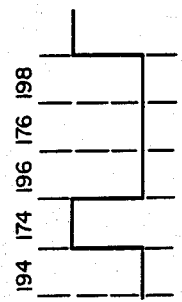
Figure 9A:
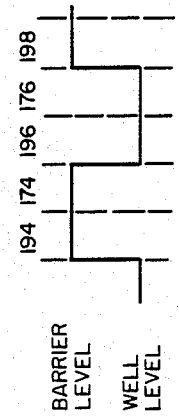

When the clocks switch in the embodiment of FIG. 8, the next well is clocked slightly before the next barrier. This is best shown by FIGS. 9a through 9c, in which FIGS. 9a and 9c represent two successive normal states, and FIG. 9b represents the switching state between them. During switching, there is thus a moment (FIG. 9b) in which there are three adjacent wells in each packet path, and one barrier for each three wells to separate the packets. In this manner, switching tolerances are not critical, yet diffusion of charges is prevented. For further protection against diffusion, the charge packets are separated by two barriers at all times other than the moment of switching.

Although the topography of the meander channels has been described herein in terms of a Pt:Si detector diode array, it will be understood that the described topography is useful in any array using meander channel CCD's in which space saving is desirable.

I claim:
1. A platinum silicide imager, comprising:
   (a) a substantially transparent semiconductor substrate;
   (b) a substantially transparent platinum silicide layer forming with said substrate a reverse-biased Schottky barrier diode; and
   (c) a metallic reflector plate adjacent to said platinum silicide layer on the side thereof opposite said substrate, said plate being electrically insulated from said platinum silicide layer and being dimensioned to extend beyond the edges of said platinum silicide layer;
   (d) said plate being electrically biased with respect to said platinum silicide layer so as to create a surface depletion layer around the periphery of said diode.
2. The imager of claim 1, in which said plate bias is substantially the same as the reverse bias of said diode.
3. The imager of claim 1, in which said plate bias is substantially greater than said diode reverse bias.
4. A platinum silicide imager comprising: a semiconductor substrate, a platinum silicide layer forming a reverse-biased Schottky barrier diode therewith, and a metallic reflector plate positioned to reflect uncaptured photons toward said platinum silicide layer, said reflector plate extending beyond the edges of said diode and means for suppressing edge leakage in said diode without reducing the photosensitive area of said diode, including means for
   biasing said reflector plate so as to create a surface depletion layer along said edges of said diode.

5. The imager of claim 4, in which said reflector plate bias is a positive bias substantially equal to the reverse bias of said diode.

6. The imager of claim 4, in which said plate bias is substantially greater than said diode reverse bias.

7. A meander channel structure for simultaneously reading out two columns of devices in charge-coupled device arrays, comprising:
   (a) a semiconductor substrate containing channel stops;
   (b) a pair of spaced parallel clock gates of heavily doped semiconductor material deposited on said substrate but insulated therefrom;
   (c) said channel stops being arranged to divide said substrate underneath said clock gates into a plurality of sections adapted to contain charges;
   (d) transfer gate means for transferring charges from the devices of said array into every other section of each of said clock gates;
   (e) barrier gates interposed between corresponding sections of said clock gates, each barrier gate being electrically connected to the downstream section adjacent thereto; and
   (f) clocking means for alternatingly applying a relatively higher potential to one of said buses and a relatively lower one to the other.

8. A meander channel structure for simultaneously reading out two column of devices in charge-coupled device arrays, comprising:
   (a) a semiconductor substrate containing channel stops;
   (b) a pair of spaced parallel lower clock gates of heavily doped semiconductor material deposited on said substrate but insulated therefrom;
   (c) said channel stops being arranged to divide said substrate underneath said clock gates into a plurality of sections adapted to contain charges;
   (d) transfer gate means for transferring charges from the devices of said array into every other section of each of said lower clock gates;
   (e) a pair of upper spaced parallel clock gates of heavily doped semiconductor material deposited on said substrate above said lower clock gates but insulated therefrom;
   (f) said upper clock gates having arms extending alternately substantially perpendicular to each other across the gap between said lower clock gates; and
   (g) clocking means for alternatingly applying a relatively higher potential to one of upper and lower of said clock gates and a relatively lower one to the other.

9. The structure of claim 8, in which said clock gates are successively clocked in such a way that pairs of wells are normally separated by pairs of barriers in the direction of charge flow.

10. The structure of claim 9, in which the next well is formed before the next barrier during the clocking process.

11. A self-demultiplexing channel structure for charge-coupled device arrays using meander channels sequentially transporting charges from pairs of adjacent devices in a row of the array, comprising:
   (a) a semiconductor substrate;
   (b) a demultiplexer channel, formed on said substrate and including:
      (i) a series of charge-retaining areas separated by barrier gates, said areas and barrier gates being grouped in groups of four, and the first area of each group being coupled to the output of one of said meander channels;
      (ii) storage gates for controlling the potential level of said areas; and
      (iii) a pair of multiplexing clock buses for clocking, respectively, the storage gates of the first and third, and the second and fourth, of said areas in each group, said clock buses electrically connecting each multiplexer channel barrier gate to the storage gate of the adjacent downstream area;
   (c) a readout channel formed on said substrate and including:
      (i) a series of charge-retaining areas separated by barrier gates, said areas and barrier gates being grouped in groups of four, and the first area of each group being coupled to the output of one of said meander channels;
      (ii) storage gates for controlling the potential level of said areas; and
      (iii) a pair of demultiplexing clock buses for clocking, respectively, the storage gates of the first and third, and the second and fourth, of said areas in each group, said clock buses electrically connecting each demultiplexer channel barrier gate to the storage gate of the adjacent downstream area;
   (d) transfer gate means interposed between the first area of each demultiplexer channel group and the first area of every other readout channel group, and between the third area of each demultiplexer channel group and the first area of the remaining readout channel groups;
   (e) first clocking means for alternately clocking the first and third, and the second and fourth, areas of said demultiplexer channel groups at a slow rate;
   (f) second clocking means for enabling said transfer gates at one-half said slow rate; and
   (g) third clocking means for alternately clocking the first and second areas of said readout channel groups at a fast rate;
   (h) whereby pairs of successive charges in said meander channels corresponding to data from a pair of said devices adjacent to each other in a row are clocked out of said meander channels at said slow rate and are stored in the first and third areas of said demultiplexer channel groups, the stored charges are transferred to the first areas of said readout channel groups at one-half said slow rate, and the charges in said readout channel areas are read out at said fast rate as sequential data from an entire row of said devices in said array.

12. In a charge-coupled device array including a semiconductor substrate having meander channels and a readout channel, the improvement comprising:
   (a) interposing a buffer channel between said meander channels and said readout channel;

(b) said buffer channel including charge storage areas and storage gates for controlling the potential of said storage areas, and said meander channels including continuous clock gate strips; and (c) said clock gate strips being integrally formed with charge storage gates of said buffer channel; and (d) providing clock buses connected to said storage gates for clocking said buffer channel;

(e) whereby the need for separate clock buses to clock said meander channels is obviated.

* * * * *